Feb. 23, 1960 A. J. RADCLIFFE, JR., ET AL 2,926,267

DIRECT-CURRENT TRANSISTOR SWITCHING AMPLIFIER CIRCUIT

Filed March 10, 1955

United States Patent Office 2,926,267

Patented Feb. 23, 1960

2,926,267

DIRECT-CURRENT TRANSISTOR SWITCHING AMPLIFIER CIRCUIT

Arthur J. Radcliffe, Jr., La Grange, and Arthur R. Denz, Chicago, Ill., assignors to International Telephone and Telegraph Corporation, New York, N.Y., a corporation of Maryland Application March 10, 1955, Serial No. 493,512

2 Claims. (Cl. 307—88.5)

This invention relates to a direct-current transistor amplifier, and more particularly to an amplifier for supplying the operating current to the receiving select magnet of a teletypewriter. Its principal object is to provide an economical and satisfactory amplifier of the foregoing character which is suitable for use with transistorized apparatus between a voice-frequency carrier transmission line and a D.C. teletypewriter.

To operate a device such as the receiving select magnet of a D.C. teletypewriter, it is necessary to supply D.C. current which is switched at high speed between a given value, such as 20 ma. and zero. When the controlling signals are low-level D.C. signals, such as may be obtained from the output of a detector with A.C. input signals, it is necessary to use a D.C. amplifier, or switching device. It has been common practice to use a vacuum tube D.C. amplifier for this purpose. In many situations, it is desirable to use transistors instead of vacuum tubes because of such advantages as reduced space and power requirements. But a transistor D.C. amplifier is usually unsatisfactory in meeting the various requirements, such as obtaining the desired output current without excessive power dissipation in the transistors, giving a fast rise of current flow with an inductive load and an equal rate of decline of current flow, and having negligible current flow in the cutoff condition.

In the D.C. amplifier according to the invention, the power dissipation in the transistors is kept low by operating them alternately at cutoff and saturation, with the transition periods short. The output stage is preferably a grounded-base type amplifier, which has a low cutoff current, and has a high output impedance during the transition periods.

According to the invention, the input transistor has its emitter terminal connected (1) through a resistor to a source of direct current of a first potential, and (2) through a diode in the output circuit path to ground; with both the emitter diode of the input transistor and the diode in the output circuit connected for current flow in the forward direction from the direct-current source. The source of input signals comprising signals of the first potential and alternative signals of a second potential is connected to the base of the input transistor. With input signals at the first potential, current flows through the diode in the output path to ground, holding the emitter terminal near ground potential; and current flow through the emitter diode of the input transistor is blocked. With input signals at the second potential, current flows through the emitter diode of the input transistor, resulting in a large collector current and a small input current, the emitter follows the input potential, and current flow is blocked through the diode in the output path.

In the preferred form, the diode in the output path is the emitter diode of an output transistor having the base grounded, and having the collector connected to a circuit including the load device and a source of direct current of the second potential.

Further, in the preferred form, a second output transistor is connected in parallel with the first, with a small resisistor connected between the emitter terminal of each output transistor and the emitter terminal of the input transistor, to equalize the current flow in the output transistors.

Further, a silicon junction diode having a lower Zener voltage (region of high current flow at a critical inverse voltage) than the output transistors is connected from the output transistor collector terminal to ground, to absorb the current during collapse of the magnetic field of the load device.

The foregoing and others objects and features of this invention and the manner of attaining them will become more apparent and the invention itself will be best understood, by reference to the following description of an embodiment of the invention taken in conjunction with the accompanying drawings comprising Figs. 1 and 2, wherein:

Fig. 1 shows apparatus for receiving signals from a voice-frequency line, converting the signals to D.C., and amplyfing them to operate a teletypewriter; and Fig. 2 shows a modified form of the D.C. amplifier.

*Detailed description*

Figures 1, 2:
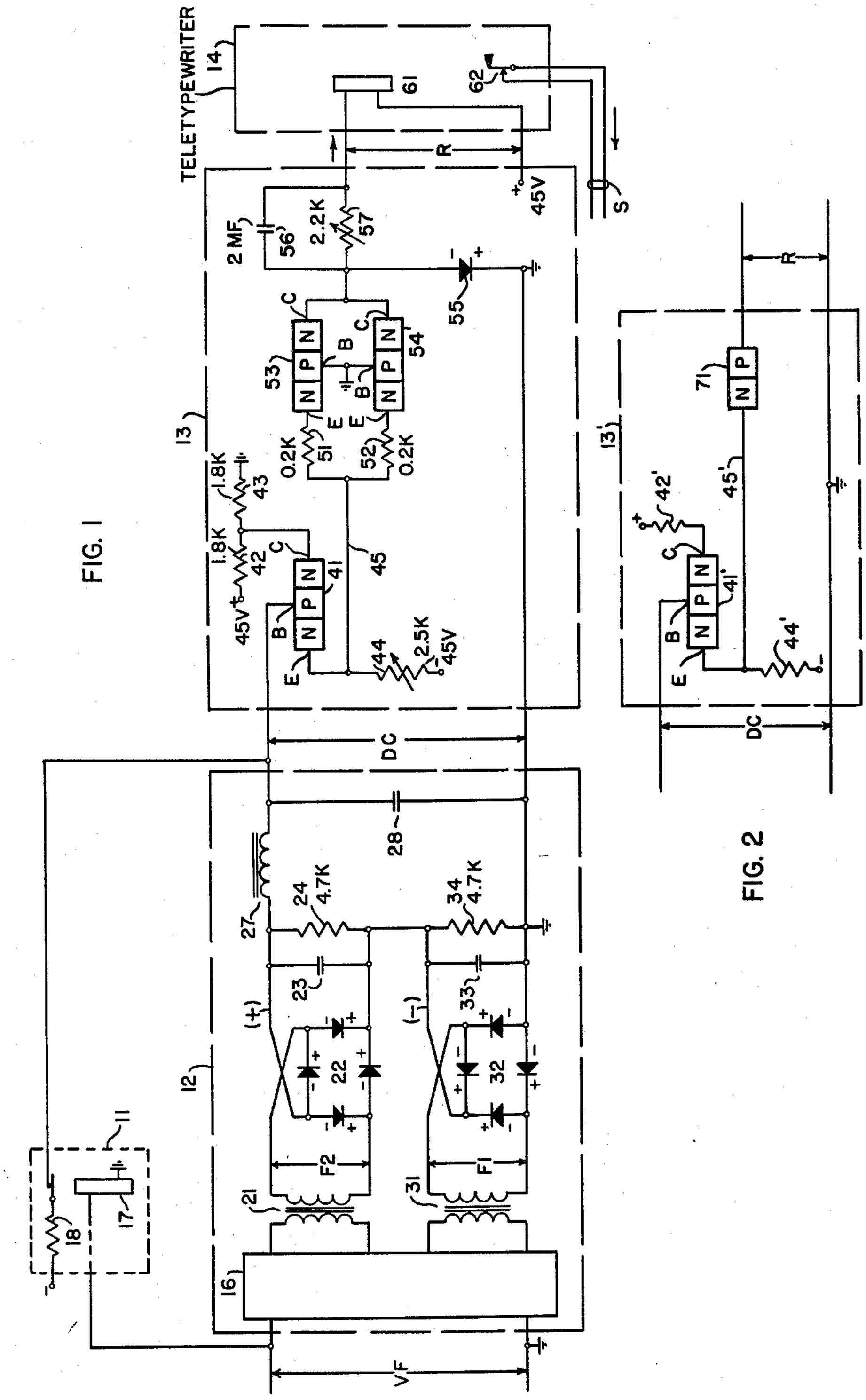

Fig. 1 illustrates the receiving portion of a telegraph-terminal coupler located between a voice frequency carrier transmission line VF and a D.C. teletypewriter 14, and is one arrangement in which the invention may be used.

Telegraph signals are received at voice frequency on line VF, are converted to direct current by detector 12, and are amplified by D.C. amplifier 13 to operate the teletypewriter 14. A threshold circuit 11 prevents operation of the teletypewriter when the signals on line VF are below a certain level.

The teletypewriter 14 includes a receiving select magnet 61 connected from line R and send contacts 62 connected to line S.

Carrier signals received on line VF, which are of the frequency shift F.M. type comprising mark signals at a frequency F1 of 1325 cycles and alternate space signals at a frequency F2 of 1225 cycles, pass through limiter amplifier and frequency discriminator circuits 16. The mark signals at frequency F1 appear through transformer 31, are rectified by bridge rectifier 32, and produce a negative D.C. voltage to ground across condenser 33 and resistor 34. The space signals at frequency F2 appear through transformer 21, are rectified by bridge rectifier 22, and produce a positive D.C. voltage to ground across condenser 23 and resistor 24. The net D.C. signals are further filtered by choke 27 and condenser 28 and are connected by line D.C. to the input of amplifier 13.

All diodes are shown with the arrow pointing in the forward direction of electron current flow, from negative to positive.

The threshold circuit 11 would actually comprise transistor circuits but is represented functionally by a relay 17 and a resistor 18. With low level or no signals on line VF relay 17 is released and the circuit is closed from negative battery through resistor 18 and the relay contacts to line D.C. and the input of amplifier 13. When the input signals reach a certain level on line VF, relay 17 operates and disconnects this negative potential, allowing amplifier 13 to be controlled by signals from detector 12.

During mark signals, with a negative potential at line D.C., output current from the amplifier 13 flows over line R to select magnet 61; and during space signals, with a positive potential at line D.C., substantially no output current flows. During quiescent receiving periods, the potential at line D.C. is negative, either from threshold circuit 11 or from a mark signal on line VF, and normal output current flows.

The D.C. amplifier 13 comprises an input transistor 41 and output transistors 53 and 54 in parallel. The transistors are of the junction type. A resistor 44 is connected from a negative 45-volt D.C. supply source to (1) the emitter terminal of transistor 41, (2) through resistor 51 to the emitter terminal of transistor 53, and (3) through resistor 52 to the emitter terminal of transistor 54. The input connection to the amplifier 13 from line D.C. is to the base of transistor 41 and ground. The collector of transistor 41 is connected to the junction of resistors 42 and 43, which are connected in series between the positive 45-volt D.C. source and ground. The base terminals of output transistors 53 and 54 are connected to ground.

The output connection is from the collector terminals of transistors 53 and 54, through resistor 57, over the upper conductor of line R, through the receiving select magnet 61 of teletypewriter 14, over the lower conductor of line R, to the positive 45-volt D.C. source. A condenser 56 is connected across resistor 57, and a silicon junction diode 55 is connected from the collector terminals of transistors 53 and 54 to ground.

When the base of transistor 41 is negative, current flows from the negative source through resistor 44 to wire 45, and divides between resistor 51 in series with the emitter diode of transistor 53 and resistor 52 in series with the emitter diode of transistor 54, to ground potential at the base terminals. A slightly negative potential results at wire 45. The base of transistor 41 is at a greater negative potential than wire 45, and current flow is blocked in the emitter diode of transistor 41. Current flows in the output path from transistors 53 and 54 through select magnet 61, and is adjusted to 20 milliamperes by means of resistors 44 and 57.

When the base of transistor 41 is at a positive potential, current flows from the negative source through resistor 44 and the emitter diode of transistor 41, causing a large collector current to flow, while the input current at the base terminal is small. The current flow through resistor 44 is sufficient that the emitter of transistor 41 follows the positive potential at the base. With a positive potential on wire 45, current flow through the emitter diodes of transistors 53 and 54 is blocked, and the current flow in the collector diodes is reduced to a negligible value.

The transistors are operated at cutoff and saturation. Therefore, their power dissipation ratings are not exceeded; and also, normal temperature variations do not have an adverse effect on the performance of the amplifier.

During mark signals, the collector potential of transistors 53 and 54 is low because of the voltage drop in resistor 57 and select magnet 61. During space signals, the collector potential of transistor 41 is low because of the voltage drop in resistor 42. Because of low collector potential during conduction, and the negligible current flow during cutoff, the transistor power dissipation is kept down.

During the transition periods between the two conditions the power dissipation is somewhat greater but the period is short.

The transistors 53 and 54 are used in parallel in the output path to keep the power dissipated by each transistor within the limits of the transistors used. The resistors 51 and 52 in series with the respective emitter diodes of the output transistors 53 and 54 are used to cause the current to divide equally between the transistors.

The measured operating voltages at the transistor terminals are as follows:

TRANSISTOR 41

| Terminal | Space, volts | Mark, volts |
|---|---|---|
| Emitter | 0.75 | −2.5 |
| Base | 0.75 | −7.0 |
| Collector | 3.00 | 23.0 |

TRANSISTORS 53 AND 54

| Terminal | Space, volts | Mark, volts |
|---|---|---|
| Emitter | 0.75 | −0.2 |
| Base | 0 | 0 |
| Collector | 45.00 | 4.5 |

Power supply regulation is aided because current is drawn at all times. The value of the current flow from the negative 45-volt source through resistor 44 is only slightly greater during space signals than during mark signals. From the positive 45-volt source, the current flows to the output circuit path during mark signals and to the input transistor during space signals, with some variation through resistor 43.

During transition the transistors 53 and 54 have a high output impedance which aids in obtaining a fast transition time. The select magnet has an inductance of about 8 henrys and a D.C. resistance of about 300 ohms. During the rise of current from substantially zero to twenty milliamperes D.C., the high output impedance of the transistors acting through condenser 56 and resistor 57 in series with select magnet 61 to the positive 45-volt source gives a sufficiently rapid period of transition.

During the decline of current the magnetic field of select magnet 61 produces a potential which aids the positive 45 volts to produce a high potential at the collector terminals of the output transistors. This potential tends to exceed the Zener voltage of transistors 53 and 54 and might produce a high current which would dissipate substantial power in the transistors and would also likely be unequally divided between the transistors. The silicon junction diode 55 is selected to have a lower Zener voltage (about 60 volts) than the transistors 53 and 54, and all are selected to have as high a Zener voltage as possible. The diode 55 therefore dissipates much of the power produced during the period of decline. Condenser 56 and diode 55 act to lower the impedance of the discharge path and prolong slightly the period of decline. The result is a wave form in which the decline of current is approximately symmetrical with the rise of current, which is desirable in the operation of the teletypewriter 14. The time of transition is about 4 milliseconds, giving satisfactory operation of the teletypewriter at 100 words per minute, equivalent to a square wave of 36 cycles per second.

The output current during space signals must be very low for proper operation of the teletypwriter 14. With the grounded base connection and the output circuit used, the cutoff current is sufficiently low.

Fig. 2 shows an amplifier 13′ which is a modification of the amplifier 13. The input stage comprises transistor 41′, with positive current supply to the collector through resistor 42′; and negative current supply to the emitter through resistor 44′. The output stage is a diode 71. The output path is from the emitter of transistor 41′, over wire 45′, through diode 71, over the upper conductor of line R, through select magnet 61 as shown in Fig. 1, over the lower conductor of line R, to ground. The operation is similar to that of amplifier 13. During mark signals with a negative potential at the base of transistor 41', current flows from the negative source through diode 71 and select magnet 61 to ground, holding wire 45' at a low negative potential which is lower than the potential at the base of transistor 41', thereby blocking current flow in transistor 41'. During space signals with a positive signal at the base of transistor 41' current flows through transistor 41' sufficient to result in a positive potential at wire 45', and thereby blocks current flow in the output path through diode 71. The desired output current may be obtained with this arrangement, but performance is not as satisfactory in other respects.

The amplifier 13 shown in Fig. 1 may be used as a direct-connected amplifier with output signals proportional to input signals over a small range of input signals. The potential on wire 45 follows the input potential at the base of transistor 41, and does not depend on the potential or impedance of the collector diode. The signals are then amplified by the grounded base amplifier 53 and 54 into an appropriate load circuit.

While we have described above the principles of our invention in connection with specific apparatus, it is to be clearly understood that this description is made only by way of example and not as a limitation to the scope of our invention.

We claim:

1. A direct-current transistor amplifier for use between a source of alternative direct-current input signals and a direct-current output line, the amplifier comprising an input stage and an output stage controlled by the input stage, the input stage comprising an input transistor arranged to operate as an emitter-follower amplifier having the signal input delivered to the base electrode of the input transistor from reference ground by way of said signal source, an emitter-bias source of direct current having one pole connected to reference ground to provide a free pole having a polarity to reference ground according to the conductivity type of the emitter electrode of the input transistor, a biasing resistor connected from the free pole of the emitter-bias source to the emitter electrode of the input transistor, circuit means providing a collector circuit path for maintaining the collector electrode of the input transistor at a potential to reference ground opposite in polarity to the said potential of the free pole of the bias source, the output stage comprising two output transistors of the same conductivity type as the input transistor and having their base electrodes each connected to reference ground, the junction of the said limiting resistor with the emitter electrode of the input transistor being connected to the emitter electrodes of the output transistors through respective similar emitter resistors, circuit means including the said output line for providing a circuit path connected in parallel to the collector electrodes of the output transistors to maintain both of such electrodes at a potential to reference ground which is also opposite in polarity to the said potential of the free pole of the said bias soruce, one said input signal causing substantially all current through the said bias resistor to flow through the emitter electrode of the input transistor to substantially block the flow of current through the electrodes of the output transistors, the other said input signal substantially blocking current flow through the emitter electrode of the input transistor to correspondingly divert emitter current through the emitter electrodes of the output transistors to thereby unblock current flow through the associated collector electrodes, the said emitter resistors insuring that substantially equal portions of the diverted emitter current flow through the two emitter electrodes of the output transistors.

2. A direct-current transistor amplifier for use between a source of alternative direct-current input signals and a direct-current output line, the amplifier comprising an input stage and an output stage controlled by the input stage, the input stage comprising an input transistor amplifier having its signal input from the signal source and having its signal output to the output stage, the output stage comprising two similar output transistors of the same conductivity type and having the base of each connected to reference ground to provide emitter-input and a collector-output operation, the reference ground being common to both stages, the signal output of the first stage comprising an output conductor extending from the first stage to the emitter electrodes of the output transistors through respective similar emitter resistors, circuit means including the said output line for providing a circuit path connected in parallel to the collector electrodes of the output transistors to maintain both of the last said electrodes at a potential to reference ground opposite in polarity to the conductivity type of such electrodes, one said input signal acting through the first stage to substantially prevent control current from flowing through the emitter electrodes of the transistor in the output stage to thereby substantially block the flow of current through the electrodes of the output transistors, the other said input signal acting through the first stage to cause control current to flow over the said output conductor and through the emitter and base electrodes of the output transistors to reference ground to unblock current flow through the associated collector electrodes, the said emitter resistors insuring that substantially equal proportions of the said control current flow through the two emitter electrodes of the output transistors, whereby the output transistors share substantially equally the output-line current flowing through their collector electrodes in parallel.

References Cited in the file of this patent

UNITED STATES PATENTS

| | | |
|---|---|---|
| 2,535,377 | Titterton | Dec. 26, 1950 |
| 2,595,496 | Webster | May 6, 1952 |
| 2,597,796 | Hindall | May 20, 1952 |
| 2,605,359 | Madsen | July 29, 1952 |
| 2,655,608 | Valdes | Oct. 13, 1953 |
| 2,655,609 | Shockley | Oct. 13, 1953 |
| 2,663,806 | Darlington | Dec. 22, 1953 |
| 2,666,150 | Blakely | Jan. 12, 1954 |
| 2,718,613 | Harris | Sept. 20, 1955 |
| 2,728,857 | Sziklai | Dec. 27, 1955 |
| 2,812,474 | Henle | Nov. 5, 1957 |

OTHER REFERENCES

Electronics, November 1953, pages 189 to 191, "Transient Analysis of Transistor Amplifiers," by W. F. Chow and J. J. Suran.

R. P. Turner: Transistors, Theory and Practice, Apr. 2, 1954, Gernsbock Publications, Inc.